(12) United States Patent  (10) Patent No.: US 8,804,137 B2
Choi et al.  (45) Date of Patent: Aug. 12, 2014

(54) UNIQUE MARK AND METHOD TO DETERMINE CRITICAL DIMENSION UNIFORMITY AND REGISTRATION OF RETICLES COMBINED WITH WAFER OVERLAY CAPABILITY

(75) Inventors: DongSub Choi, Sungnam (KR); Amir Widmann, Sunnyvale, CA (US); Zain Saidin, San Mateo, CA (US); Frank Laske, Weilburg (DE); John Robinson, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 672 days.

(21) Appl. No.: 12/819,281

(22) Filed: Jun. 21, 2010

(65) Prior Publication Data

US 2011/0051150 A1  Mar. 3, 2011

Related U.S. Application Data

(60) Provisional application No. 61/238,276, filed on Aug. 31, 2009.

(51) Int. Cl.
*G01B 11/14* (2006.01)

(52) U.S. Cl.
USPC .......................................................... 356/620

(58) Field of Classification Search
USPC ........................................... 356/399–401, 620
See application file for complete search history.

(56) References Cited

U.S. PATENT DOCUMENTS

| 7,158,233 | B2 * | 1/2007 | Tanaka .......................... 356/401 |
| 7,468,331 | B2 * | 12/2008 | Huggins ....................... 438/800 |
| 2006/0039595 | A1 | 2/2006 | Adel et al. |
| 2008/0057418 | A1 | 3/2008 | Seltmann et al. |
| 2009/0040536 | A1 | 2/2009 | Chiu et al. |

FOREIGN PATENT DOCUMENTS

| JP | 2003-515918 | 5/2003 |
| JP | 2004-508711 | 3/2004 |
| JP | 2004-134474 | 4/2004 |
| JP | 2007-96069 | 4/2007 |
| KR | 10-2005-0066889 A | 6/2005 |
| WO | 01/38939 A2 | 5/2001 |
| WO | 02/19415 A1 | 3/2002 |

* cited by examiner

*Primary Examiner* — Tara S Pajoohi Gomez
(74) *Attorney, Agent, or Firm* — Suiter Swantz pc llo

(57) ABSTRACT

A combined metrology mark, a system, and a method for calculating alignment on a semiconductor circuit are disclosed. The combined metrology mark may include a mask misregistration structure and a wafer overlay mark structure.

21 Claims, 11 Drawing Sheets

$$\begin{array}{cccc} a & b & c & d \\ a' & b' & c' & d' \\ a'' & b'' & c'' & d'' \\ a''' & b''' & c''' & d''' \end{array}$$

scan average

UNIQUE MARK AND METHOD TO DETERMINE CRITICAL DIMENSION UNIFORMITY AND REGISTRATION OF RETICLES COMBINED WITH WAFER OVERLAY CAPABILITY

CROSS-REFERENCE TO RELATED APPLICATION

This application claims priority from Provisional Application Ser. No. 61/238,276 filed on Aug. 31, 2009, which is hereby incorporated by reference in its entirety.

TECHNICAL FIELD

The present invention generally relates to a device and method used for overlay metrology, and more particularly to a device and method using a combined metrology mark including a reticle misregistration mark and a wafer overlay mark.

BACKGROUND

As geometries continue to shrink, manufacturers often utilize optical techniques for performing non-destructive inspection and analysis of semiconductor wafers. Wafer test metrology equipment and techniques may often be used to verify that the wafer has not been damaged by previous processing steps as well as to measure alignment.

One critical process control technique used in the manufacturing of an integrated circuit may include the measurement of overlay accuracy between successive, patterned layers on a wafer. An additional process control technique may include the measurement of periodic structure alignment formed on a single layer formed by at least two separate processes.

SUMMARY

A combined metrology mark, a system, and a method for calculating alignment on a semiconductor circuit are disclosed. The combined metrology mark may include a mask misregistration structure and a wafer overlay mark structure.

A system may include means for accepting alignment information for at least one pattern on at least one layer of a semiconductor device by utilizing a combined metrology mark, means for calculating alignment error, and means for presenting a calculated correlation between mask data and wafer data.

A method may include accepting alignment information for at least one pattern on at least one layer of a semiconductor device by utilizing a combined metrology mark, calculating alignment error, and presenting a calculated correlation between mask data and wafer data.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1:
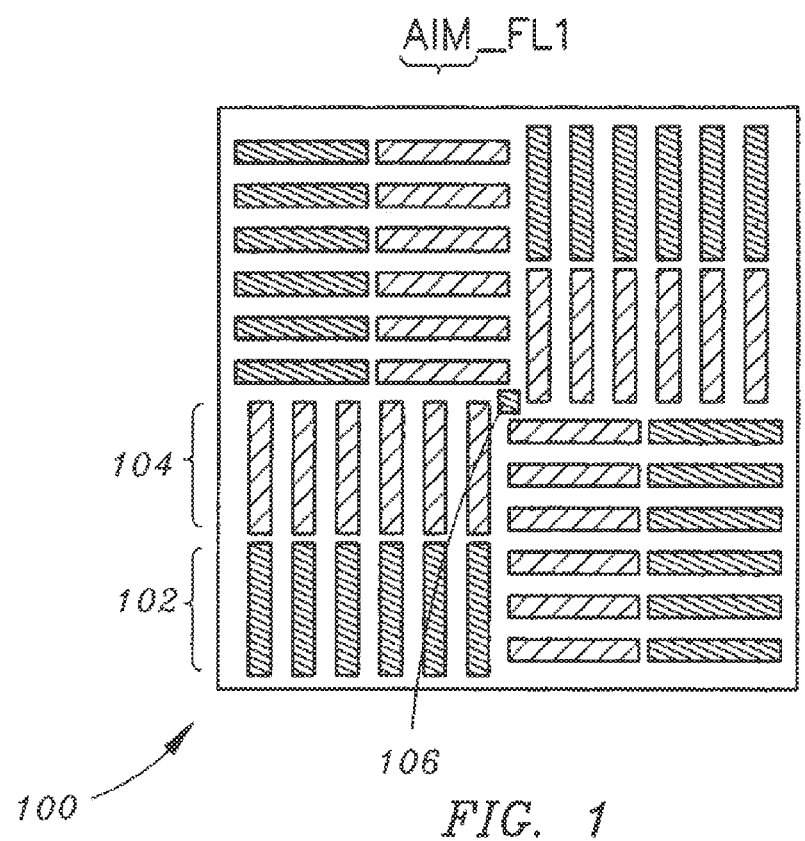
FIG. 1 is a top plan view illustrating an exemplary combined metrology mark configured for measuring alignment between two integrated circuit layers and alignment information between two different patterns on a same layer.

Reference will now be made in detail to the subject matter disclosed, which is illustrated in the accompanying drawings.

Referring generally to FIGS. 1 through 4, a combined metrology mark 100, system 300, and method 400 for calculating alignment on a semiconductor circuit is disclosed. The combined metrology mark 100 may include a mask misregistration structure 102 and a wafer overlay mark structure 104. System 300 may include means for accepting alignment information for at least one pattern on at least one layer of a semiconductor device by utilizing a combined metrology mark, means for calculating alignment error, and means for presenting a calculated correlation between mask data and wafer data. Method 400 may include accepting alignment information for at least one pattern on at least one layer of a semiconductor device by utilizing a combined metrology mark, calculating alignment error, and presenting a calculated correlation between mask data and wafer data.

Reticle manufacturing involves printing mask misregistration marks and measuring those marks for reticle process control, disposition, and engineering analysis. Wafer manufacturing involves printing wafer overlay marks and measuring those marks for wafer process control, disposition, and engineering analysis. Generally, mask misregistration marks and wafer overlay marks are different, and the data processing of a mask misregistration mark and a wafer overlay mark is separate. For example, a wafer fab generally does not use mask data (either critical dimension or misregistration) other than for mask quality information, such as verifying that the mask is within specification.

Figure 2:
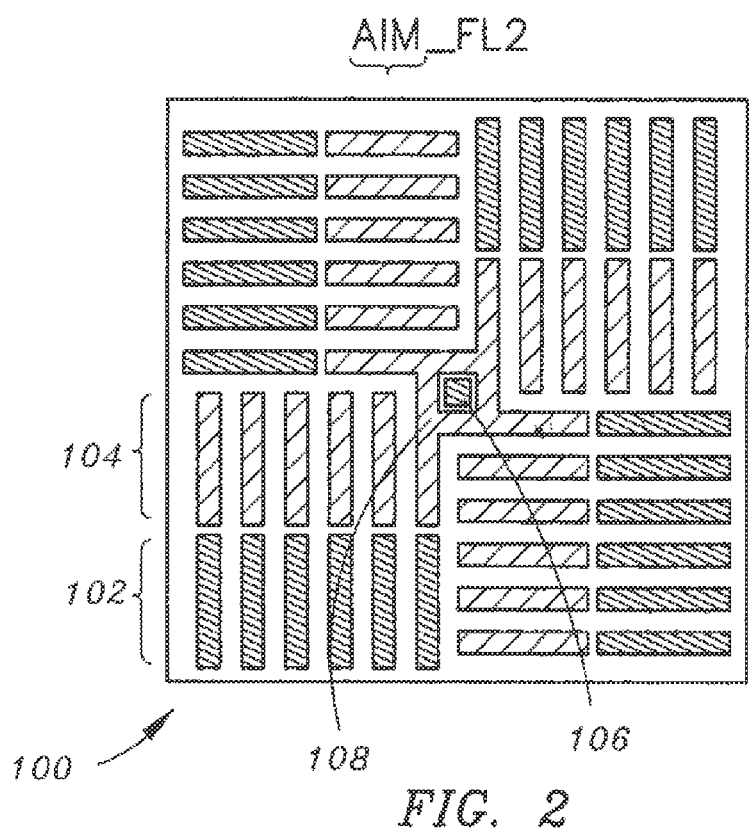
FIG. 2 is a top plan view illustrating an exemplary combined metrology mark configured for measuring alignment between two integrated circuit layers and alignment information between two different patterns on a same layer.

FIGS. 1 and 2 illustrate a combined metrology mark 100 for both reticle misregistration metrology and for wafer overlay metrology. By combining a reticle alignment mark and a wafer overlay mark, direct comparisons can be made, and subsequent data analysis for process control, disposition, and engineering analysis can be less prone to errors. Mark co-location may eliminate the need for spatial extrapolation and interpolation and may provide more accurate results.

Combined metrology mark 100 may include an outer layer working zone 102 and an inner layer working zone 104. Additionally, combined metrology mark 100 may include a distinguishing characteristic, such as a box 106 and/or a cross. In an embodiment, combined metrology mark 100 may include four outer layer working zones configured to provide overlay information in a first direction, such as the y direction. Of the four working zones, two may be disposed in a first substrate layer and two may be disposed in a second layer of substrate. In this embodiment, the centers of symmetry of the working zones may coincide exactly and the configuration of the working zones is rotationally symmetric around the center of the mark (90°, 180°, 270°, and 360°). Each of the working zones may include a periodic structure with at least one coarsely segmented line. The sizes, spacing, and/or widths of each line may be widely varied. As shown, the periodic structures in each outer layer working zone 102 may be oriented in the same direction while the periodic structures in each inner layer working zone 104 may be oriented in the same direction but in a different direction from the periodic structures in each outer layer working zone 102.

Figure 6A:
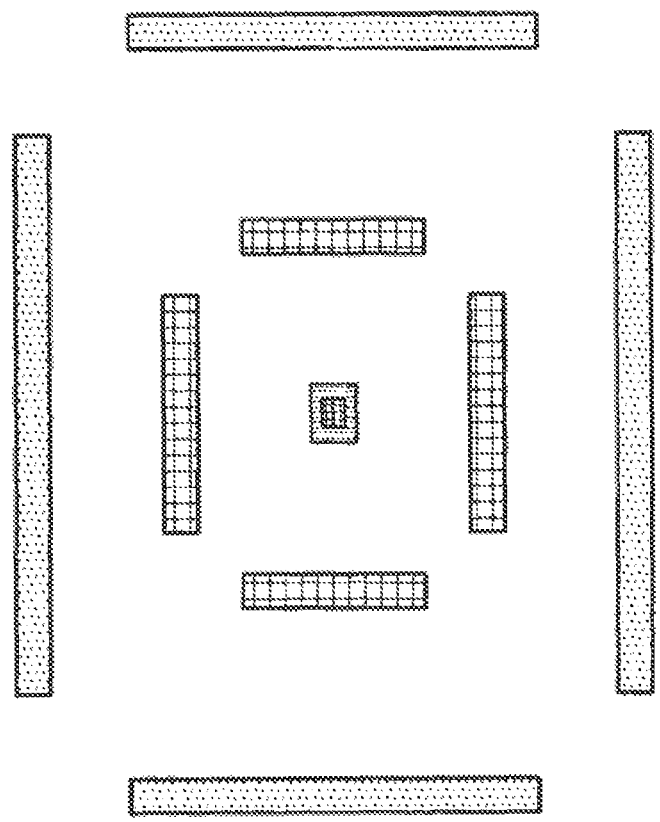
FIG. 6A illustrates an exemplary combined metrology mark.
Figure 6B:
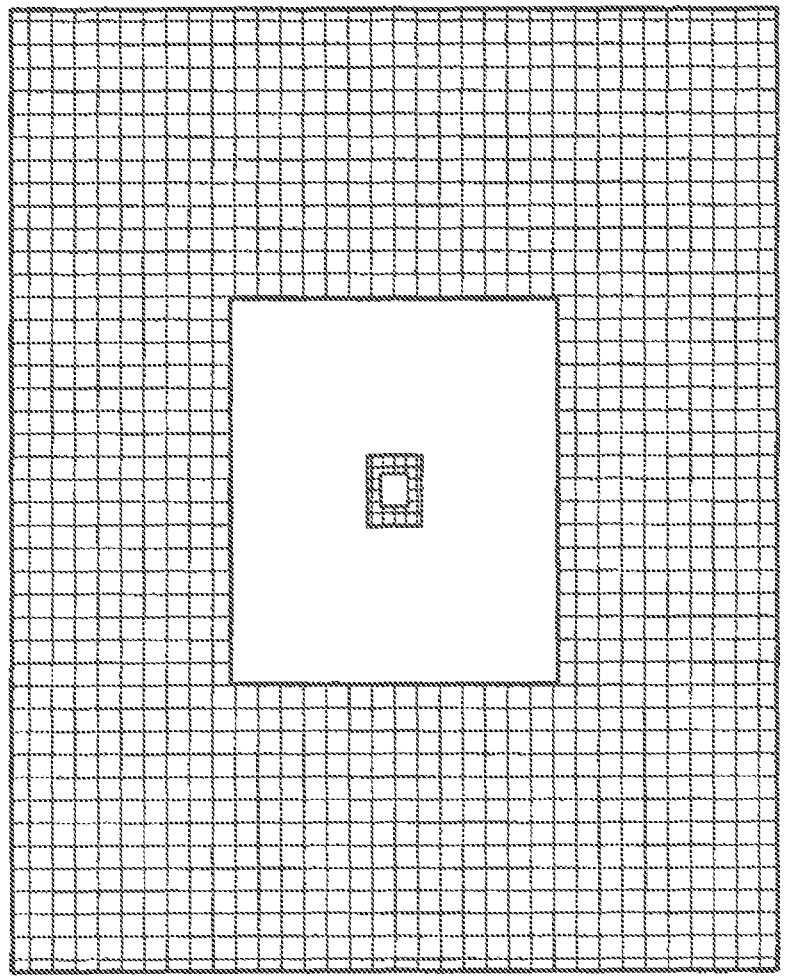
FIG. 6B illustrates an exemplary combined metrology mark.

Further, the combined metrology mark 100 may be utilized in the automated combined use of reticle misregistration data and wafer overlay data for improving wafer processing, such as process control, disposition, and engineering analysis and may be extended to critical dimension data. Wafer overlay data analysis may split into grid analysis and field analysis. The grid overlay data analysis may include error contributions primarily from the scanner, process, and metrology. The field overlay data analysis includes error contributions primarily from the scanner, the mask, and metrology. Knowing explicitly the error contribution from the mask may improve the ability to quantify, separate, and reduce all of the sources of error. A further example of a combined metrology mark 100 used in a bar-in-bar configuration is illustrated in FIG. 6A. A further example of a combined metrology mark 100 used in a box-in-box configuration is illustrated in FIG. 6B.

Figure 3:
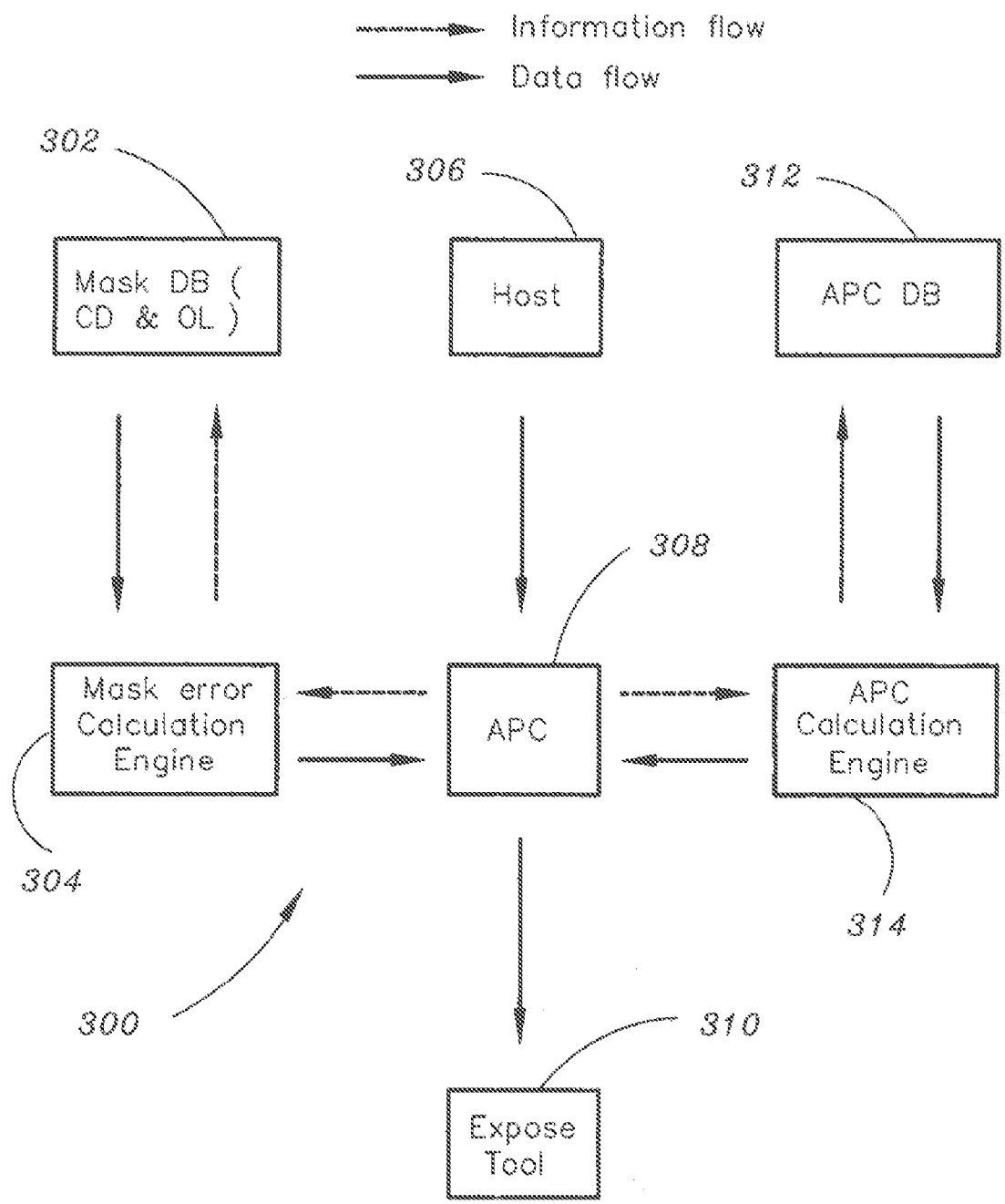
FIG. 3 illustrates a process flow diagram in which a combined metrology mark is analyzed.

As shown in FIG. 3, a wafer fab may use information obtained after utilizing a combined metrology mark 100 and obtaining mask data. For example, the information flow may include mask data, lot data, lot history data, data regarding the process tools used (such as the expose tool, CMP, etching, deposition, etc.). The data flow may be based on the information flow. For example, host 306 may indicate specific information to be selected from a mask database 302 and an advanced process control database (APC DB) 312. In this example, a mask error calculation engine 304 and advanced process control APC calculation engine 314 may calculate correctables and send them to the expose tool 310 through advanced process control (APC) 308.

Figure 4:
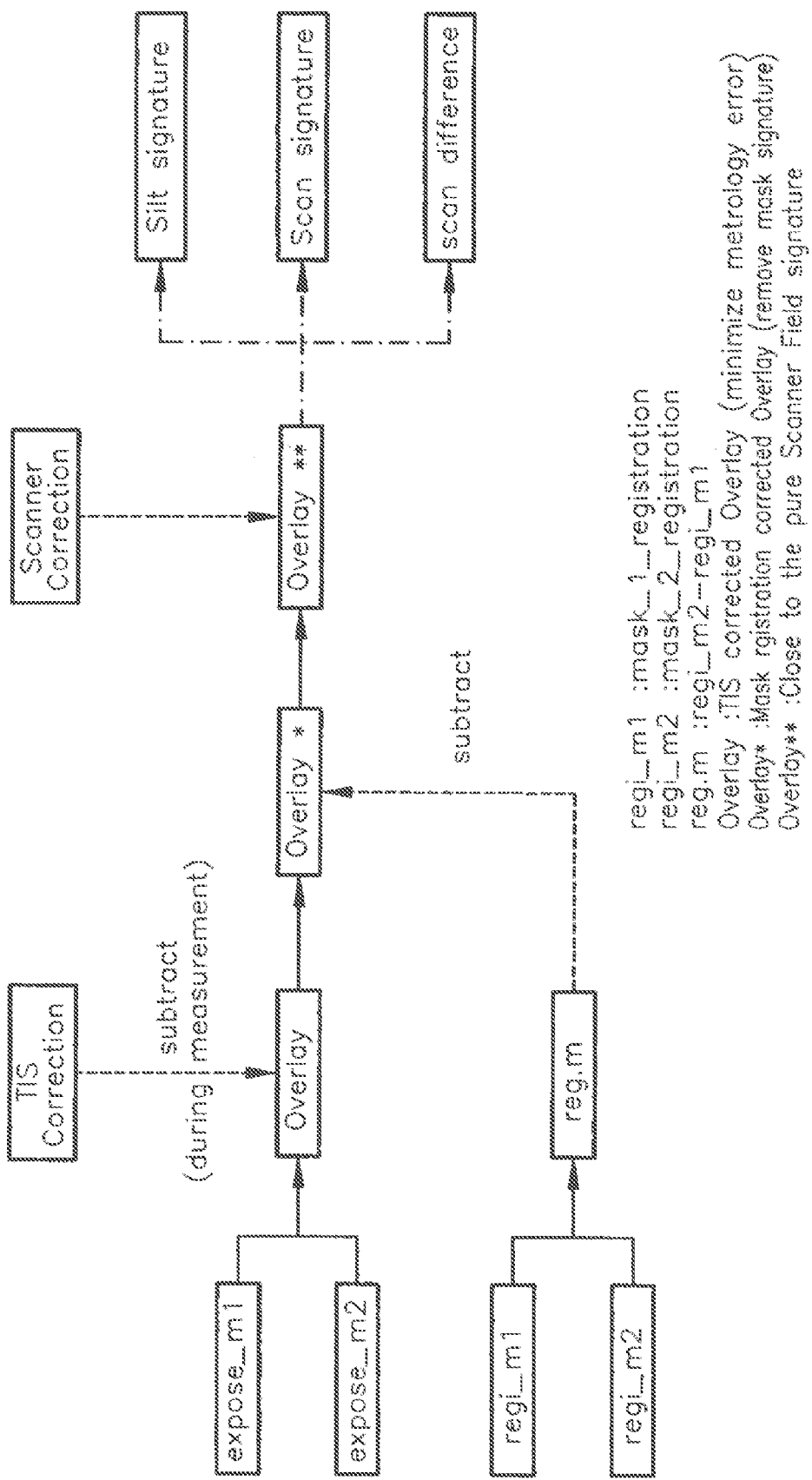
FIG. 4 illustrates a process flow diagram in which information obtained from a combined metrology mark is analyzed.

FIG. 4 generally illustrates a method for determining a scanner field signature. Scanner-related wafer field overlay error may be extracted from combined metrology mark 100 measurement data by extracting mask error (i.e. error resulting from discrepancies between designed mask placement and actual mask placement) from wafer overlay error. Wafer overlay(field) may be expressed as $$WaferOverlay_{(field)} = \sqrt{(\delta_{Scanner}^2 + \delta_{Mask}^2 + \delta_{Process}^2 + \delta_{Metrology}^2)}.$$

By coinciding the mask metrology and wafer metrology using the combined metrology mark 100, it may be expressed as $$WaferOverlay_{(field)} - Mask = \sqrt{(\delta_{Scanner}^2 + \delta_{Process}^2 + \delta_{Metrology}^2)}.$$

Process influence (e.g. errors resulting from the effects of manufacturing processes such as etching, chemical/mechanical polishing, deposition, etc.) may be minimized by applying linear field correction for each field independently and may be expressed as $$WaferOverlay_{(field)} - Mask \approx \sqrt{\delta_{scanner}^2 + \delta_{metrology}^2}.$$

In this case, the metrology error (e.g. errors resulting from metrology tools such as lack of precision, tool induced shift and tool induced shift variability (TIS 3Sigma)) portion is relatively smaller than the scanner portion (the scanner's single machine overlay ("SMO") may be 6 nm, while the metrology total measurement minimizing ("TMU") may be 1 nm). Additionally, by using 0° and 180° measurement and performing a tool induced shift ("TIS") correction per measurement site, the metrology error may be minimized and/or neglected. Thus, wafer overlay(field) may be expressed as $$WaferOverlay_{(field)} - Mask \approx Scanner_{(field)}.$$

After extracting pure scanner field signature using the above method, it may be possible to analyze detailed error components of scanner field overlay error utilizing the following equation:

$$Scanner_{(field)} = \Delta\mu_{scanner} + \sqrt{\partial_{scanner}^2} \quad (\Delta: \text{systematic}, \delta: \text{non-systematic}).$$

Figures 5A, 5B:
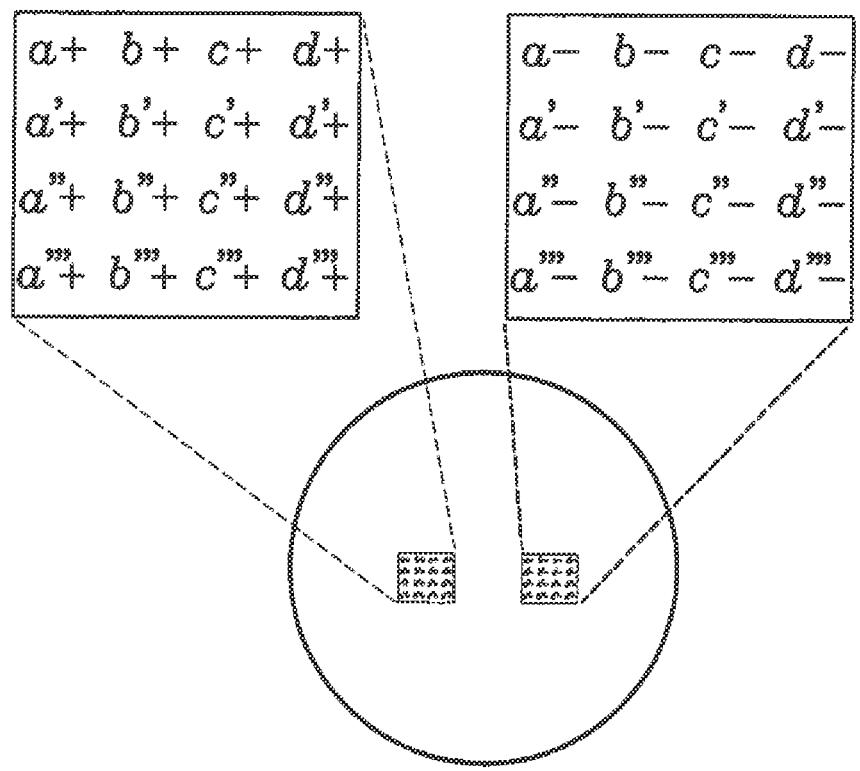
FIGS. 5A through 5C illustrate methods for determining a slit signature, scan signature, and/or scan difference.
Figure 5C:
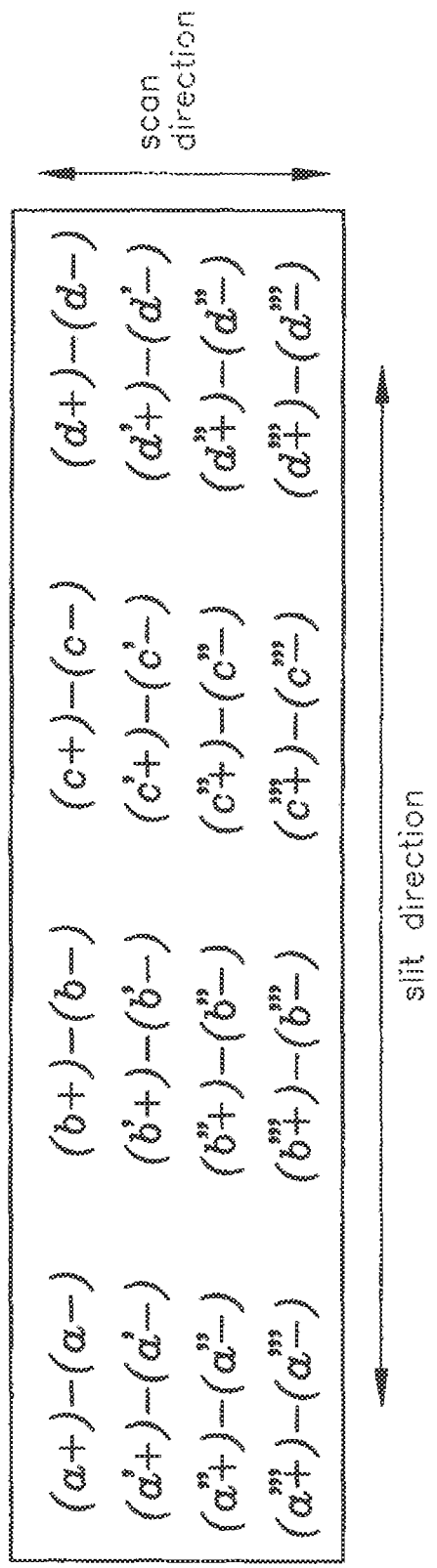

Further illustrated by FIGS. 5A through 5C, slit signature, scan signature, and/or scan difference may be determined from the scanner field signature (shown above as Scanner$_{(field)}$). Each slit position may use the average of the same slit position. For example, the slit position of an A position may be expressed as $$S(a) = AVG(a+, a'+, a''+, a'''+, a-, a'-, a''-, a'''-).$$

The scan signature may be determined by subtracting the slit signature from the scan average according to slit position. For example, scan signature may be expressed as $$a - S(a), a' - S(a), a'' - S(a), a''' - S(a)).$$

The scan difference may include the difference of the +scan and the −scan as illustrated in FIG. 5C.

Figure 7:
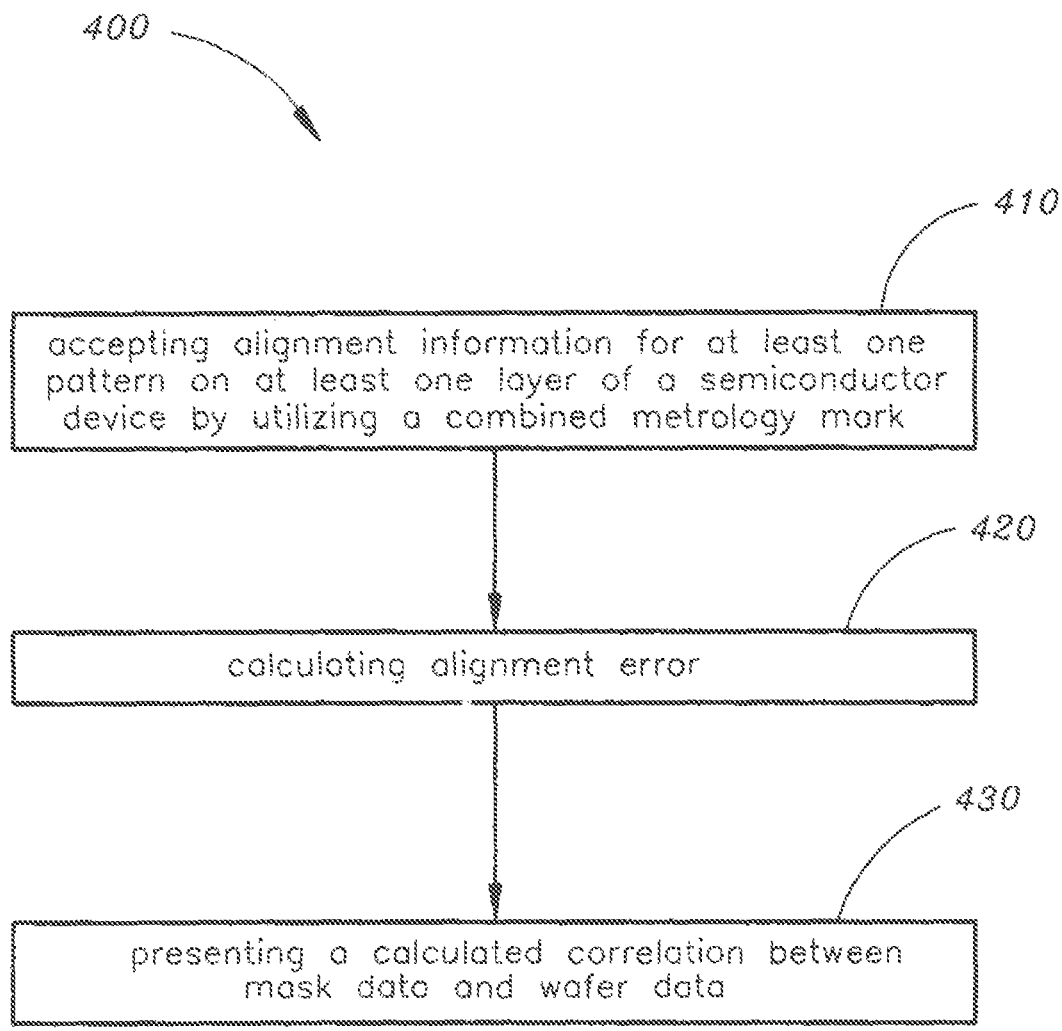
FIG. 7 illustrates a process flow diagram in which a combined metrology mark is analyzed.

FIG. 7 illustrates a method 400 for calculating alignment error. By using an extracted scanner(field) signature, each error component of the scanner may be monitored. Operation 410 illustrates accepting alignment information for at least one pattern on at least one layer of a semiconductor device by utilizing a combined metrology mark. In an example, first the lens signature may be monitored by averaging the same scan direction position of the extract scanner signature. Second, the stage signature (stage synchronization) may be monitored by extracting lens signature from the scanner(field) signature and subtracting average values from all the same slit position data. Third, the scan direction may be monitored by using a separate display of +scan and −scan in the equation:

$$\Delta\mu_{Scanner} = \mu_{Scanner_2} - \mu_{Scanner_1}$$

Fourth, drift may be monitored by each field's field correction parameters as the order of exposure on a single wafer and as the order of exposed wafers. Fifth, mask chucking may be monitored by utilizing (0D*+180D*)/2, where 0D* and 180D* is the wafer overlay during 0° of reticle exposure and during 180° of reticle exposure. Additionally, the above method(s) may be used without extracting mask data if the same mask was used to expose both the mask misregistration mark and the wafer overlay mark. In one embodiment, a computer processor may accept mask registration information and at least one critical dimension file into wafer overlay and critical dimension analysis software.

Operation 420 illustrates calculating alignment error. For example, calculating the Extract Mask critical dimension error portion of wafer critical dimension error may be performed by using the same critical dimension target for both mask critical dimension measurement and wafer critical dimension measurement. For example, 20×20 μm targets may be used on the reticle that translate to smaller 5×5 μm targets on a wafer, and both targets may be measured with metrology apparatus that extract critical dimension uniformity ("CDU") information from both the reticle and the wafer. In one embodiment, a computer processor may convert mask registration data and critical dimension data with wafer scale and required orientation to match wafer data and/or remove at least one outlier using an algorithm (e.g. a threshold filter). In an additional example, a computer processor may apply a relevant model (e.g. e-beam writer or scanner correction models such as a polynomial model) to mask data and display at least one of raw data, modeled data, or residual data, and the computer processor may calculate the correlation between mask data and wafer data (e.g. a difference or $R^2$ value). Use of the combined metrology mark allows for determining the relation and influence of the mask to the wafer.

Operation 430 illustrates presenting a calculated correlation between mask data and wafer data. For example, a calculated correlation may be presented to a display, for example, or to a printer. In an additional example, other alignment information may be presented to a mobile device. In a further example, mask registration information and wafer overlay information may be presented together, mask critical dimension error information and wafer critical dimension error information may be presented together, mask error information may be presented subsequent to subtracting at least one of wafer overlay information and critical dimension data information, and/or mask error information may be presented subsequent to subtracting wafer overlay information and critical dimension data information. In an additional embodiment, reticle error may be decomposed from wafer error by measuring critical dimension targets on a reticle and then measuring the same location printed on a wafer.

Scanner qualification, or calibration, may be implemented during production using mask registration and wafer overlay information. In this example, the correlation between mask registration and wafer overlay may serve as a measure of the scanner influence on wafer overlay. Ideally, there is no influence on wafer overlay by the scanner. When there is no scanner influence on wafer overlay, the registration signature on the mask may be directly reflected on wafer overlay. Additionally, the registration signature on the mask may be the same as the overlay signature on wafer, which means the correlation value is 1 or is close to 1. When scanner influence on the wafer overlay becomes high (i.e., negative performance), the correlation becomes less, or close to 0.

In order to minimize the noise between a registration measurement and a wafer overlay measurement, it may be necessary to identify both a mask registration measurement and a wafer overlay measurement. For example, the same metrology pattern may be measured for both registration measurement and wafer overlay measurement. A wafer overlay mark may be created with 2 exposures by the scanner, which may mean that each wafer overlay measurement is already the delta, or difference between exposures. However, mask registration is being done for each mask. Therefore, the mask registration error, which may be used for determining a correlation, may be calculated by subtracting a first mask registration value from a second mask registration for each measurement location. For example, illustrated in FIG. 4, a single point correlation may be calculated by the correlation of wafer overlay measurement vs. $mask_2$ minus $mask_1$. In another example, a single mask may be exposed twice for calculating mask registration error.

Figure 8:
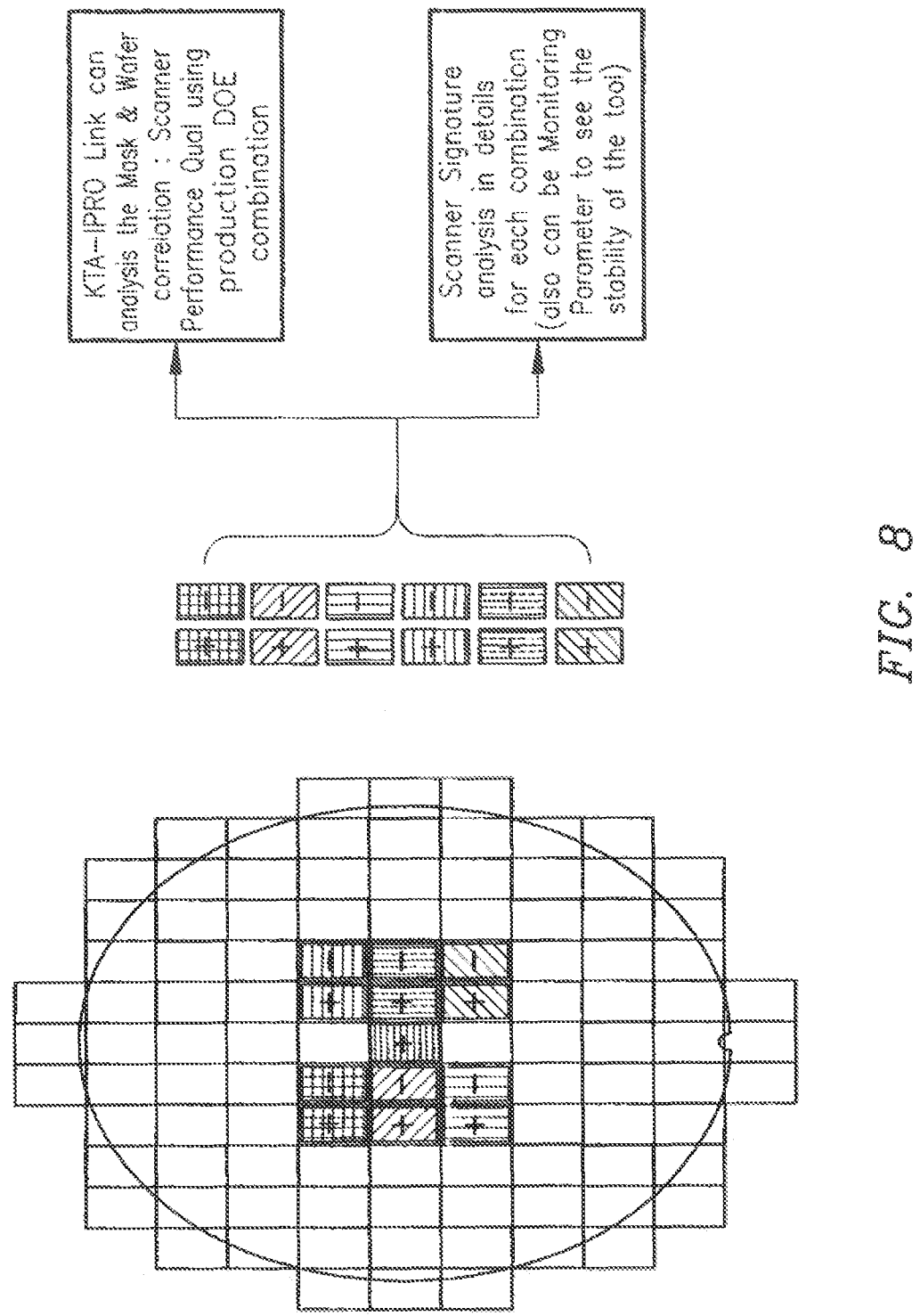
FIG. 8 illustrates an example of multiple exposure conditions on a wafer.

Additionally, it is important to qualify scanner performance for wafer overlay under real production conditions. In an embodiment, the wafer for scanner qualification may be created by utilizing a combination exposure, such as the combination exposure illustrated in FIG. 8. FIG. 8 illustrates a design of experiment ("DoE") where variation is present while gathering information for determining the relationship between different factors in a process, such as exposure conditions. In this example, six different exposure combinations are utilized including one exposure combination being the same for a first and second exposure and four different combinations utilized for the third through sixth exposures. Additionally, more than six exposure combinations may be used.

FIG. 8 further illustrates a DoE exposure combination for multiple wafer fields. A single scanner often implements the many different DoE exposure and/or illumination combinations during production. In order to maximize the efficiency of scanner qualification, it may be necessary to expose multiple DoE conditions on the same wafer. As shown on the wafer in FIG. 8, each DoE combination may be exposed on multi-fields which contains an equal number of plus scan fields and minus scan fields.

Figure 9:
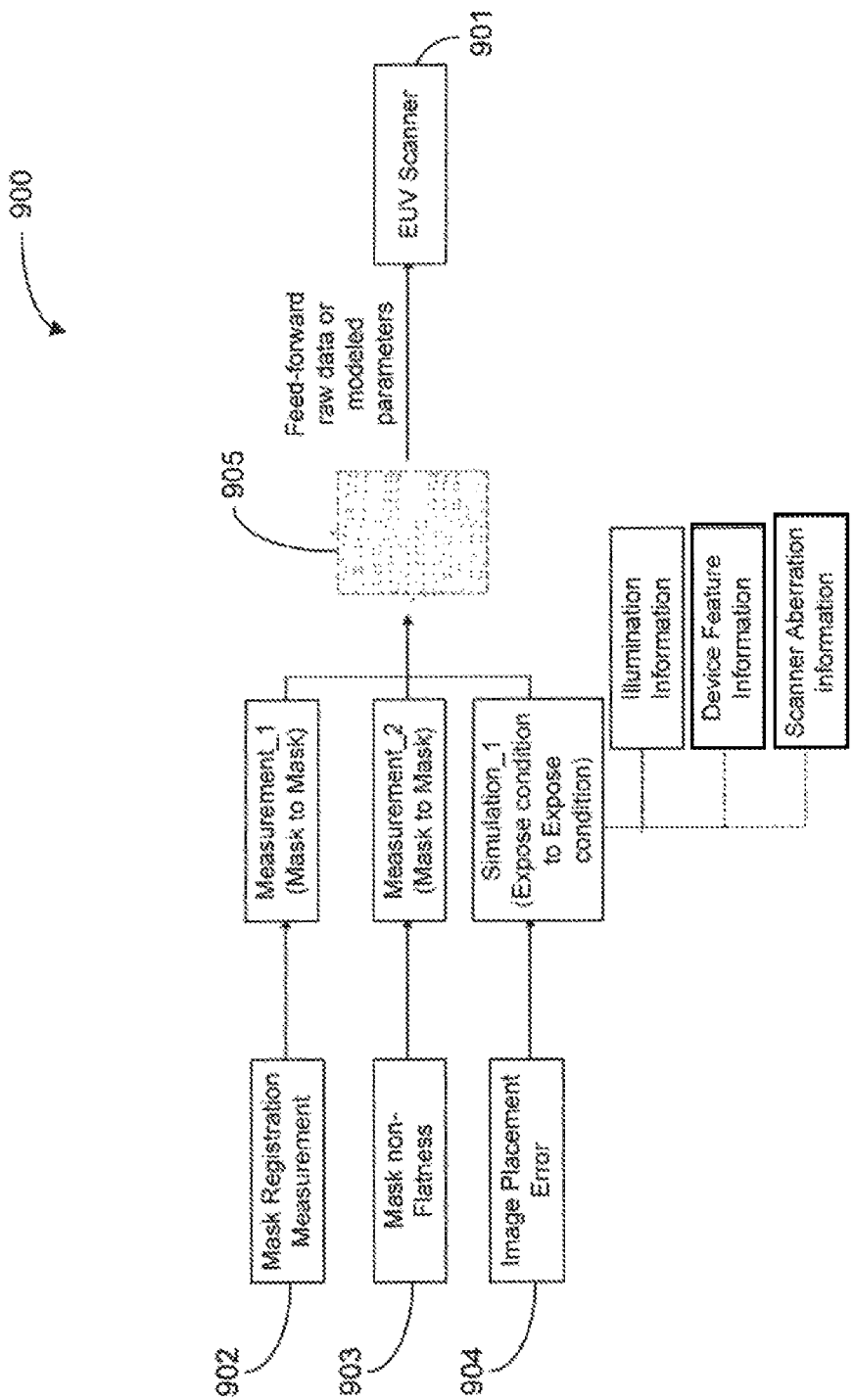
FIG. 9 illustrates a process flow diagram in which information obtained from a combined metrology mark is analyzed.

FIG. 9 illustrates a data flow diagram 900 for a providing mask-induced overlay error data to an extreme ultraviolet (EUV) scanner 901. The overlay error data may include mask registration error measurement data 902, mask non-flatness error data 903 and image placement error data 904. As discussed above with respect to FIG. 4, mask registration error may be calculated by subtracting a first measured mask registration value from a second measured mask registration for a given measurement location.

Figure 10:
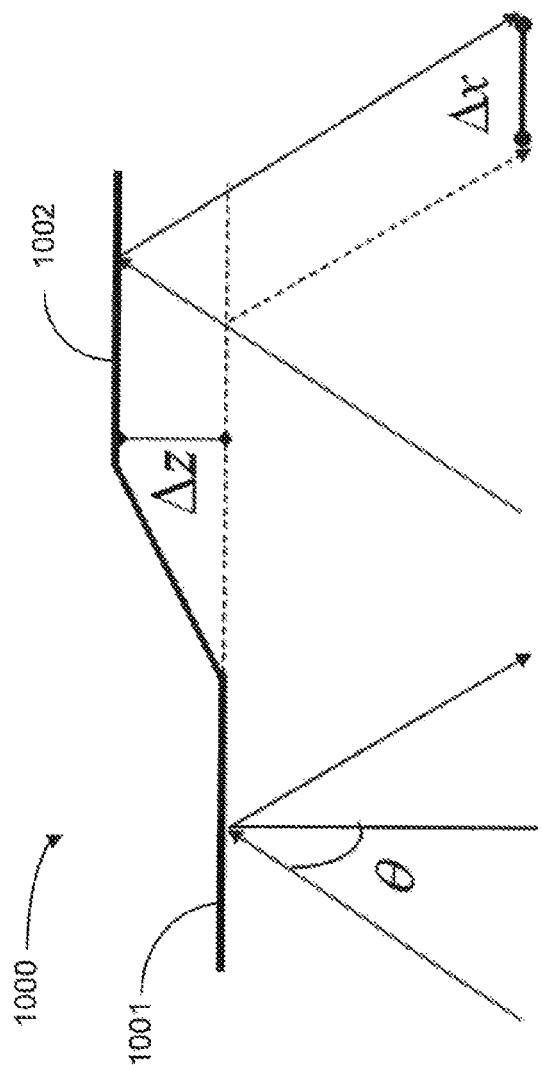
FIG. 10 illustrates a mask having a non-flat surface.

FIG. 10 illustrates mask non-flatness errors that may be induced by a non-planar portion of a mask 1000. When, disposed on a chuck, a mask 1000 may have a substantially planar portion 1001 and an at least partially non-planar portion 1002 as in relation to the planar portion 1001. The degree of deviation from the substantially planar portion 1001 to the at least partially non-planar portion 1002 may be represented by a height differential ($\Delta z$) which may be based on mask metrology or on a scanner reticle stage. The height differential may be measured. A mask shift value ($\Delta x$) representing the non-flatness error may be computed according to equation:

$$\Delta x = \frac{\Delta z \times \tan\theta}{M}$$

where $\theta$ an the angle of incidence and M is a magnification ratio between the mask and a wafer. The mask shift value ($\Delta x$) for various masks may be compared to generate mask non-flatness error data.

Referring again to FIG. 9, the image placement error may be computed through comparison of pattern placement error (e.g. error due to comatic aberration due to a wavefront of a projection lens) resulting from various expose conditions (e.g. illumination, device feature information and scanner aberration information.)

The mask registration error measurement data 902, mask non-flatness error data 903 and image placement error data 904 may be combined into an overlay error signature 905. The overlay error signature 905 may be provided as an input to an EUV scanner 901 whereby the EUV scanner 901 may utilize the overlay error signature 905 to carry out scanner calibration or qualification to compensate for those errors.

In the present disclosure, the methods disclosed may be implemented as sets of instructions or software readable by a device embodied in a tangible media, such as memory. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A method for wafer processing, comprising:
   accepting alignment information for at least one pattern on at least one layer of a semiconductor device determined from a combined metrology mark including:
      a wafer overlay mark structure configured to provide alignment information between two different patterns on at least two successive layers of a substrate;
      a mask misregistration structure configured to provide alignment information between two different patterns on a same layer and disposed at least partially within a perimeter of the wafer overlay mark structure;
   calculating alignment error; and
   presenting a calculated correlation between mask data and wafer data.

2. The method of claim 1, wherein the accepting alignment information for at least one pattern on at least one layer of a semiconductor device determined from a combined metrology mark including a mask misregistration structure and a wafer overlay mark structure comprises:
   accepting alignment information for at least one pattern on at least one layer of a semiconductor device determined from a combined metrology mark including at least one of a mask misregistration structure and a wafer overlay mark structure including a grating based mark.

3. The method of claim 2, wherein the accepting alignment information for at least one pattern on at least one layer of a semiconductor device determined from a combined metrology mark including at least one of a mask misregistration structure and a wafer overlay mark structure including a grating based mark comprises:
   accepting alignment information for at least one pattern on at least one layer of a semiconductor device determined from a combined metrology mark including at least one of a mask misregistration structure and a wafer overlay mark structure including at least two rectangular working zones, where a first set of working zones includes a periodic structure comprised by at least one coarsely segmented line oriented in a first direction and a second set of working zones includes a periodic structure comprised by at least one coarsely segmented line oriented in a second direction oriented orthogonally to the first direction.

4. The method of claim 1, wherein the accepting alignment information for at least one pattern on at least one layer of a semiconductor device determined from a combined metrology mark further comprises:
   accepting alignment information for at least one pattern on at least one layer of a semiconductor device determined from a combined metrology mark including a box shaped structure disposed substantially in the middle of the combined metrology mark.

5. The method of claim 4, wherein the accepting alignment information for at least one pattern on at least one layer of a semiconductor device determined from a combined metrology mark including a box shaped structure disposed substantially in the middle of the combined metrology mark comprises:
   accepting alignment information for at least one pattern on at least one layer of a semiconductor device determined from a combined metrology mark including a 1 µm contact box.

6. The method of claim 1, wherein the accepting alignment information for at least one pattern on at least one layer of a semiconductor device determined from a combined metrology mark comprises:
   accepting alignment information for at least one pattern on at least one layer of a semiconductor device determined from a combined metrology mark including a cross shaped structure disposed substantially in the middle of the combined metrology mark.

7. The method for wafer processing in claim 1, wherein the accepting alignment information for at least one pattern on at least one layer of a semiconductor device determined from a combined metrology mark comprises:
   accepting mask registration information and at least one critical dimension data file.

8. The method for wafer processing in claim 1, wherein the calculating alignment error comprises:
   converting mask registration data and critical dimension data with wafer scale and required orientation to match wafer data.

9. The method for wafer processing in claim 1, wherein the calculating alignment error comprises:
   removing at least one outlier using an algorithm.

10. The method for wafer processing in claim 1, wherein the calculating alignment error comprises:
    applying a relevant model to mask data and displaying at least one of raw data, modeled data, or residual data.

11. The method for wafer processing in claim 1, wherein the calculating alignment error comprises:
    calculating the correlation between mask data and wafer data.

12. The method for wafer processing in claim 1, wherein the presenting a calculated correlation between mask data and wafer data comprises:
    presenting mask registration information and wafer overlay information together.

13. The method for wafer processing in claim 1, wherein the presenting a calculated correlation between mask data and wafer data comprises:
    presenting mask critical dimension error information and wafer critical dimension error information together.

14. The method for wafer processing in claim 1, wherein the presenting a calculated correlation between mask data and wafer data comprises:

presenting mask error information subsequent to subtracting at least one of wafer overlay information and critical dimension data information.

15. The method in claim 1, further comprising:
identifying a mask registration measurement and a wafer overlay measurement;
creating a wafer overlay mark by double exposure by the scanner; and
calculating a mask registration error by subtracting a first mask registration value from a second mask registration value.

16. The method for wafer processing in claim 15, wherein the identifying a mask registration measurement and a wafer overlay measurement comprises:
creating the mask registration measurement by exposing a single mask twice.

17. The method for wafer processing in claim 15, wherein the creating a wafer overlay mark by double exposure by the scanner comprises:
utilizing an exposure condition combination.

18. The method in claim 1, further comprising:
receiving mask registration error data;
receiving mask non-flatness error data; and
performing at least one of mask calibration and qualification according to the mask registration error data and the mask non-flatness error data.

19. The method in claim 18, further comprising:
receiving image placement error data; and
performing at least one of mask calibration and qualification according to the image placement error.

20. A system comprising:
means for accepting alignment information for at least one pattern on at least one layer of a semiconductor device determined from a combined metrology mark including:
a wafer overlay mark structure configured to provide alignment information between two different patterns on at least two successive layers of a substrate, and
a mask misregistration structure configured to provide alignment information between two different patterns on a same layer and disposed at least partially within a perimeter of the wafer overlay mark structure;
means for calculating alignment error; and
means for presenting a calculated correlation between mask data and wafer data.

21. A system comprising:
a semiconductor device layer alignment detector configured for generating alignment information;
a processing device configured for:
accepting alignment information from the semiconductor device layer alignment detector associated with at least one pattern on at least one layer of a semiconductor device determined from a combined metrology mark including:
a wafer overlay mark structure configured to provide alignment information between two different patterns on at least two successive layers of a substrate;
a mask misregistration structure configured to provide alignment information between two different patterns on a same layer and disposed at least partially within a perimeter of the wafer overlay mark structure;
calculating alignment error; and
a presentation device configured for presenting a calculated correlation between mask data and wafer data.

* * * * *